United States Patent [19]

Elmer et al.

[11] 4,021,682
[45] May 3, 1977

[54] CHARGE DETECTORS FOR CCD REGISTERS

[75] Inventors: Ben R. Elmer, Glendale; Wallace E. Tchon, Phoenix, both of Ariz.

[73] Assignee: Honeywell Information Systems, Inc., Phoenix, Ariz.

[22] Filed: June 30, 1975

[21] Appl. No.: 591,667

[52] U.S. Cl. .................. 307/362; 307/221 D; 307/279; 307/DIG. 3
[51] Int. Cl.$^2$ ............ H03K 5/20; G11C 19/28; H03K 5/18; H03K 3/353
[58] Field of Search ....... 307/221 C, 221 D, 235 F, 307/235 J, 235 H, 235 T, 238 V, 279, DIG. 3

[56] References Cited

UNITED STATES PATENTS

| | | | |
|---|---|---|---|
| 3,758,794 | 9/1973 | Kosonocky | 307/DIG. 3 |
| 3,774,176 | 11/1973 | Stein et al. | 307/279 X |
| 3,882,326 | 5/1975 | Kruggel | 307/235 F X |
| 3,891,977 | 6/1975 | Amelio et al. | 307/DIG. 3 |
| 3,892,984 | 7/1975 | Stein | 307/238 X |
| 3,955,101 | 5/1976 | Amelio et al. | 307/221 D |

OTHER PUBLICATIONS

Suzuki et al., "A Static RAM with Normally–Off–Type Schottky Barrier FETs;" *Dig. of Technical Papers of the 1973 IEEE Int'l Solid–State Circuits Conference*; pp. 36–37 and 196; 2/14/1973.
Boyle et al., "Charge Coupled Semiconductor Devices;" *Bell System Tech. Journal*; pp. 587–593; 4/1970.
Gaensslen, "FET Diode Stored Charge Memory Cell;" *IBM Tech. Discl. Bull.*; vol. 11, No. 8, pp. 997–998; 1/1969.
Furman; "Sense Latch Circuit For Memory Cells;" *IBM Tech. Discl. Bull.*; vol. 16, No. 9, pp. 2792–2793; 2/1974.

*Primary Examiner*—John S. Heyman
*Assistant Examiner*—Larry N. Anagnos
*Attorney, Agent, or Firm*—William W. Holloway, Jr.; Ronald T. Reiling; Nicholas Prasinos

[57] ABSTRACT

The invention comprises circuitry for detecting relatively small amounts of charge emitted from a CCD register. The circuit acts as a differential amplifier, differentiating between charge levels corresponding to logical zeros and logical ones and generates corresponding system level logic signals. A reference charge is developed by a self-tracking reference charge injector. Both the reference charge and the charge packet to be sensed are coupled to the differential amplifier via buffering diode-coupled transistors. The circuit provides for a REFRESH mode of operation, but may be modified to also allow for READ, WRITE or PARTIAL-WRITE modes of operation.

11 Claims, 4 Drawing Figures

4,021,682

CHARGE DETECTORS FOR CCD REGISTERS

RELATED APPLICATIONS

The following applications assigned to the same assignee named herein are incorporated by reference to the instant application:

No. 1. "Multiphase Series-Parallel-Series Charge Coupled Device Registers" inverted by Ben R. Elmer et al., Ser. No. 592,156, filed on June 30, 1975.

No. 2. "Multiphase Series-Parallel-Series Charge Coupled Device Registers With Simplified Input Clocking" invented by Ben R. Elmer et al., Ser. No. 591,724, filed on June 30, 1975.

No. 3. "Charge Injectors for CCD Registers" invented by Wallace E. Tchon, Ser. No. 592,147, filed on June 30, 1975.

No. 4. "CCD Register Interface With PARTIAL-WRITE Mode," invented by Ben R. Elmer and Wallace E. Tchon, Ser. No. 591,723, filed on June 30, 1975.

No. 5. "Chain Selection Scheme in a Fault-Tolerant Mode and Circuits for Implementing Same," invented by Ben R. Elmer, Ser. No. 592,155, filed on June 30, 1975.

No. 6. "Fault-Tolerant CCD Memory Chip," invented by Ben R. Elmer, et al., Ser. No. 591,666, filed on June 30, 1975.

BACKGROUND OF THE INVENTION

1. Field of the Invention

This invention relates generally to charge-coupled devices and in particular to methods and apparatus for sensing and amplifying charge as it is emitted from CCD registers.

2. Description of the Prior Art

Charge-coupled devices (CCDs) may be used as storage devices in data processing (and optical) systems. A primary advantage which they offer is the potential for cost reduction in terms of cost per bit. In order to achieve this type of reduction, it is essential to have high densities within the CCDs. (CCD registers with high density capabilities are described in related applications Nos. 1 and 2.)

Higher density may be achieved by use of storage sites which occupy only small areas on a chip. This implies less charge storing capability within each site, and hence, less charge representative of bits of information. In other words, to achieve higher density, it is required to store and transport smaller quantities or packets of charge within the device. This has the effect of requiring a highly-sensitive detector or amplifier attached to the output terminal of the device so as to be able to detect these small charge packets.

It is further noted that the SPS register configurations described in the above-mentioned applications, Related Application Nos. 1 and 2, require only one amplifier per 256 storage sites. This high ratio of storage sites per amplifier is a measure of high density. Part of this savings in area required may be used for a better sense amplifier, which must be provided since the amount of charge is so small. Furthermore, packets of charge may be transferred up to 50 times between sense and amplification. Therefore, dissipation of charge is also a factor which must be accounted for in the design of the SPS registers and the charge detectors associated therewith.

Charge transported through the CCD corresponds to logical zeros or ones. Since the charge levels are so small, typically 50 to $230 \times 10^{-15}$ Coulombs, the difference between the presence of a charge packet or no-charge, or a one and zero, is very small. Similarly, the signal to noise ratio within the CCD may be relatively low. Clearly, there is a need for a more sensitive detector as density increases.

Amplifiers are of course available in the prior art. One type may be termed "single-ended input." In such an amplifier, of critical importance is the pre-charge level. A pre-charge diode conditions the single-ended input terminal to a known voltage. After such conditioning, the diode turns off and the input terminal receives either a charge, which establishes a new level, or no-charge from the CCD. This new level is then used as an input to an inverter which acts as an amplifier. Such single-ended input devices are linear and have the advantage of being small. Hence, they are good for configurations such as the serpentine which require numerous amplifiers. However, their sensitivity is insufficient for use in the present purposes. Specifically, they cannot sense differences between the relatively small amounts of charge in question.

Accordingly, it is desirable to use the general principle of a differential amplifier, which is well known in the prior art. After two (opposing) nodes of the differential amplifier have been pre-charged to a known reference voltage, the input signal is delivered to a first node and a reference signal delivers a reference voltage to the second node. The imbalance between these two nodes is sensed and amplified. However, CCDs encounter special problems. If the input signal sense node is not isolated from the CCD register, and if it receives too much charge, then this sense node will act as an input signal from the amplifier to the CCD, i.e., it will inject charge back into the CCD register. Hence, the input node must be stabilized and isolated. Similarly, it is essential that the reference voltage be highly regulated. In the prior art, sense amplifiers used a reference voltage developed at one spot on the chip and distributed to the registers thereon. However, this reference voltage wanders with respect to the 1 and 0 and is not locked directly to variations in the injector circuit, i.e., variations in the amount of charge first injected into each charge packet. These variations put limits on the reference voltage method.

OBJECTS OF THE INVENTION

It is an object of the present invention therefore to provide an improved detector for sensing relatively small amounts of charge.

It is another object of the present invention to provide a sense amplifier which converts signals from a CCD charge level to a system logic level.

It is another object of the present invention to provide a differential amplifier with an input pre-charge node isolated from the CCD register to which it is attached.

It is still another object of the present invention to provide a differential amplifier in which a reference charge is developed by the clocked-source method.

It is still yet another object of the present invention to provide a differential amplifier including means for developing a reference charge which is related to variations in the charge injector circuit.

It is a further object of the present invention to provide a sense amplifier to be used in combination with a high-density SPS CCD register.

It is yet a further object of the present invention to provide a sense amplifier to be used in combination with circuitry to provide an input/output interface wth a system data bus.

Other objects and advantages of the present invention will become apparent to those of ordinary skill in the art when read in conjunction with the drawings contained herein.

SUMMARY OF THE INVENTION

The invention comprises circuitry for sensing and amplifying packets of charge emitted from CCD storage registers. After storage within and transmission through the CCD registers, the packets of charge must be sensed to detect differences of less than $170 \times 10^{-15}$ Coulombs. The stability of the reference charge relative to the input signal allows these very small differences to be sensed and the small packets of charge to be amplified.

The circuitry includes a differential amplifier which contains two isolation nodes. One of the nodes receives charge through a first isolation diode from a reference injector; the other receivers charge through a second isolation diode from the CCD register. Upon actuation of a regeneration circuit, the differentiator amplifies the difference between the two nodes to a logic level. The resulting logic signal is further amplified so it can be used as input signal to an injector circuit for the CCD register. The amplifier signal could also be used as a logical level signal for output to a system data bus.

DESCRIPTION OF THE PREFERRED EMBODIMENT

Figure 1:
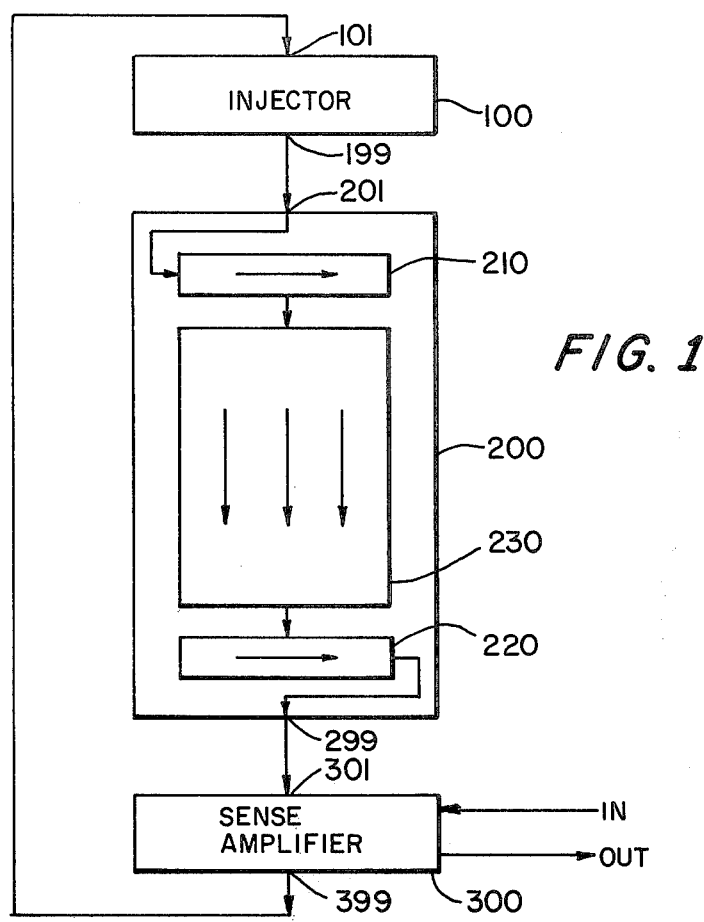
FIG. 1 is a block diagram of an SPS CCD register with an associated injector and sense amplifier.

Referring now to FIG. 1, a block diagram of CCD register storage system is shown. All of the components in the CCD register storage system are integrated within a single semiconductor chip which may contain a plurality of such register systems. (For additional details, see related application No. 6.) It is noted that a single line connecting various blocks within FIG. 1 may represent a plurality of connecting leads. Also, the unconnected arrowheads in FIG. 1 represent direction of flow of information bits. The basic element of FIG. 1 is a block 200 which represents an SPS register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. CCD sites (or cells) comprising section 210 are also connected to central section 230. Section 210 is coupled to section 230 via a row of gates which allows parallel transfer of information into central section 230. Information bits are then propagated through the lengthwise section of central section 230. In the preferred embodiment, central section 230 is eight bits wide by 32 effective-bits long, thereby providing a 256-bit shift register. The arrows inside of section 230 represent the parallel propagation of information through section 230. At the other (output) end of section 230, the information bits in the form of charge packets are transferred into output serial section 220. Upon receiving the information bits, output section 220 transfers the bits serially to the output section output terminal, which is effectively the output terminal 299 of SPS register 200.

SPS register 200 receives, transfers, and transmits information in the form of small packets of charge in the order of 50 to $230 \times 10^{-15}$ Coulombs. Clearly, these charges are not of a level equivalent to logic signals at a system level. Accordingly, the register must be buffered in order to handle and transmit appropriate input and output signals. The present invention is directed to buffering and conversion problems.

The packets of charge emitted from SPS register 200 must be sensed and amplified, i.e., refreshed, before further propagation. Additionally, they must be converted to appropriate logic levels before they can be bused to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shaft register 200. It is also desirable to perform periodically a conventional refresh of the information bits stored in the register 200. This is performed by simply serially shifting the packets of charge from the register to the amplifier, and reinjecting them after they have been amplified. This operation is identical to a read operation with the exception that the latter also entails busing the information, at a logic level, to other system components. Such output busing is done over output line OUT shown in FIG 1.

Input busing may be done via line IN to amplifier 300. Accordingly, in this CCD storage system, amplifier 300 is considered to include interface circuitry responsive to control signals for directing the flow of information through the system to perform REFRESH, READ and WRITE operations. (For detailed description of such interface circuitry which may be used within sense amplifier 300, see related application No. 4.)

An output terminal 399 of amplifier 300 is also connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of injector 100, see related application No. 3; and of the SPS registers, see related application Nos. 1 and 2.)

Figure 2:
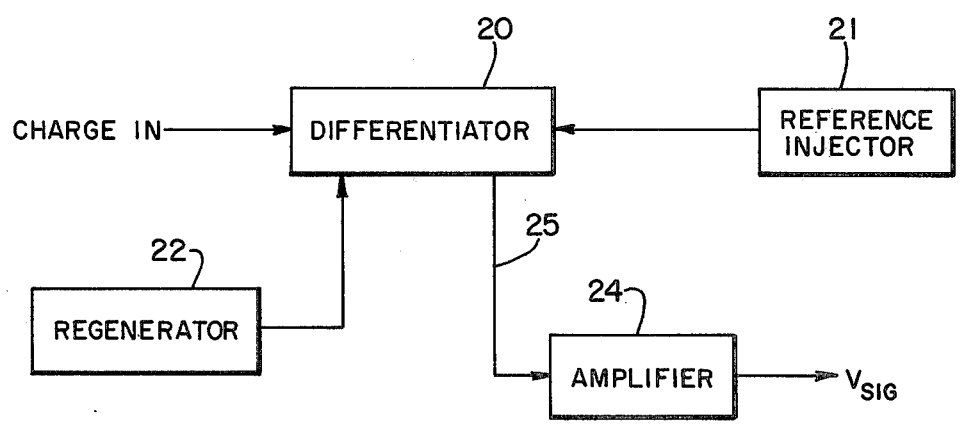
FIG. 2 is a block diagram of the sense amplifier comprising the invention.

Referring now to FIG. 2, the basic components of amplifier 300 are shown in block diagram form. It is noted that this amplifier does not contain circuitry for interfacing with an I/O bus. Such a modified amplifier is shown and described in Related Application No. 4. Differentiator 20 receives two input signals. The CHARGE IN signal is transmitted from the output terminal 299 of the CCD storage register; the second signal is transmitted by the reference injector 21. A third input signal to differentiator 20 comes from regenerator 22. This last signal however is a control signal. The output signal from differentiator 20 is a system level logical zero or one on line 25. This signal is further amplified by amplifier 24 and is used as an input signal $V_{Sig}$ to the injector 100. Another (inverse) output signal $\overline{V_{Sig}}$ from differentiator 20 may be generated and sent to a modified injector 100 and/or may be used as the output signal for operation in a READ mode.

Figure 3:
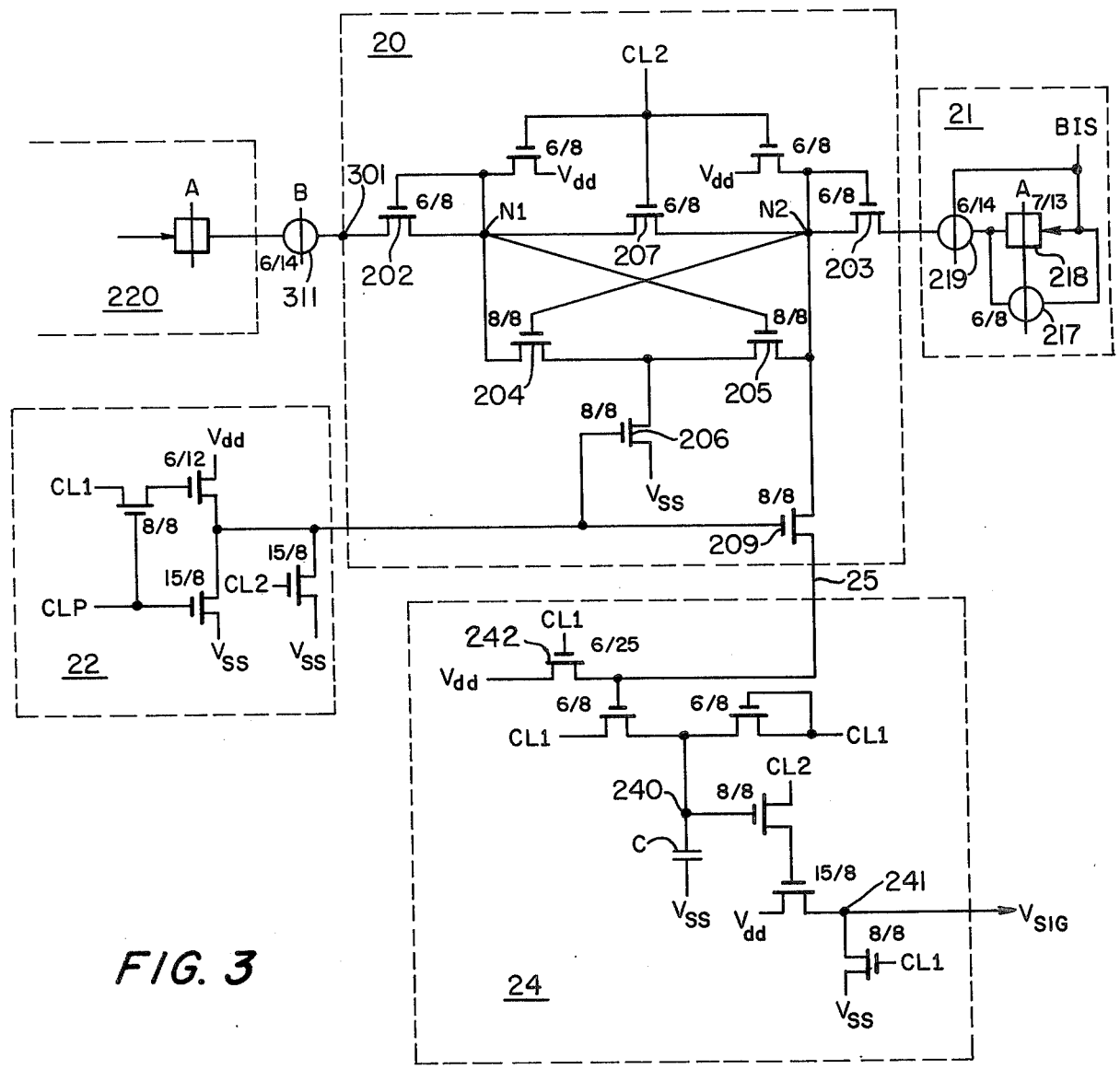
FIG. 3 is a detailed circuit diagram of the sense amplifier comprising the invention.
Figure 4:
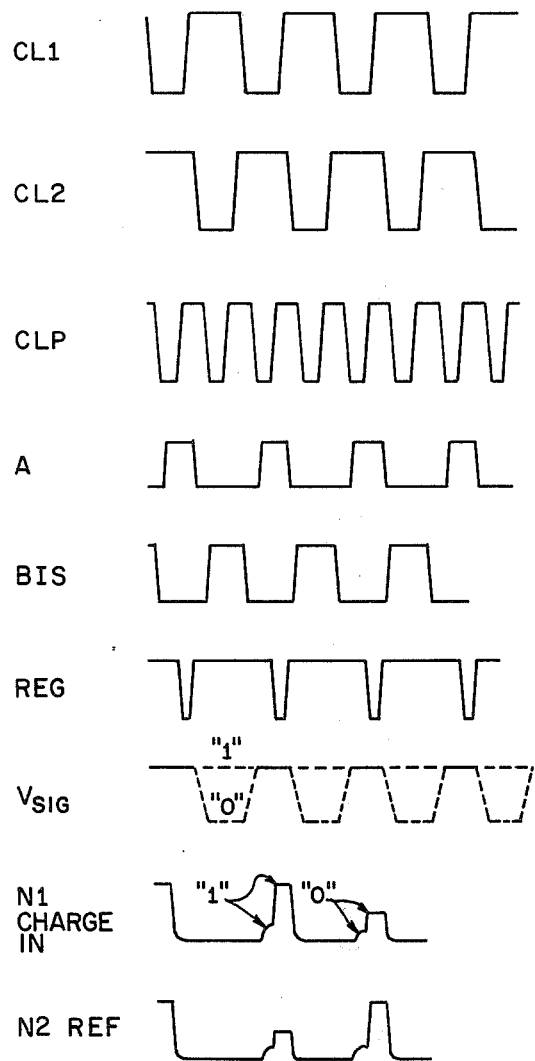
FIG. 4 is a timing diagram showing the relationship between various phases used in the present invention.

Referring now to FIGS. 3 and 4, the detailed circuitry of the invention and the timing of the phases used in connection with this circuitry are shown respectively. Circuitry for the phases is shown in related application Nos. 1 and 2. Reference injector 21 comprises sites 217 and 218 with their electrodes coupled to phase A and gating site 219 with its electrode coupled to phase BIS. (Site 218 is partially implanted forming an input barrier region of about 7 × 8 microns square and sites 217 and 219 are fully implanted forming barrier regions of about 6 × 8 and 6 × 14 microns square respectively. Site 217, with an effective overlap (storage) region of about 12 microns square, is used to develop a fat zero charge packet and site 218 is used to develop a charge packet equal to about one-half of a signal charge packet. Charge packets from both sites 217 and 218 are commonly fed into gating site 219. Phase BIS is the clocked source for reference charge injection. The common usage of phase BIS as the clocked source to sites 217 and 218 and the gating signal for gating site 219 results in gating site 219 being an effective forward blocking gate for injection of reference charge packets into differentiator 20. Phase BIS is a 1 MHZ pulse train and is identical to phase B except that it is connected to reference voltage $V_{SS}$ instead of $V_{RR}$. The purpose of reference injector 21 is to pass through diode-connected transistor 203 a reference charge which appears at node N2 as a charge of about 140 Femto Coulombs ($10^{-15}$ Coulombs). (It is noted that this is the midpoint level between a zero and a one charge level representation, 50 and 230 Femto Coulombs respectively.) Similarly, the input signal CHARGE IN from the last site of output section 220 of the CCD register 200 passes through fully implanted gating site 311, through diode-connected transistor 202, and appears at node N1 as a charge of (approximately) either 50 to 230 Femto Coulombs. This charge level is inexact due to both noise and dissipation of charge during its transfer through the SPS register. Diode-coupled transistors 202 and 203 are essential to proper operation of the circuit. They act to lock in the charge packets delivered to nodes N1 and N2 respectively. The timing relationship of charge from reference injector 21 and from the output section 220 is as follows: charge is stored in sites coupled to phase A and is passed through gating sites 219, 311 coupled to phase B (or BIS). Gating site 311 is bi-directional and coupled to phase B which has only a 10 volt amplitude. Node N1 may be charged to a level of 12 volts. Unless node N1 is isolated by some other means from output section 220, charge will flow from node N1 into output section 220. The means of preventing this flow is diode-coupled transistor 202 which provides a unidirectional path from input terminal 301 to node N1. Transistor 203 provides a similar blocking role to the degree necessary (which is limited due to the coupling of gating site 219 to phase BIS) and also provides timing balance between nodes N1 and N2.

Differentiator 20 operates a detect the difference between the change levels at node N1 and node N2. Upon receiving a signal from regenerator 22, a small difference in charge at nodes N1 and N2 is detected and amplified as described infra, and an appropriate logic level signal is sent to amplifier 24 over line 25.

The level of charge detected by differentiator 20 corresponds to approximately a 0.5 volt difference between node N1 and N2. Node N2 (which contains the reference charge) will be at approximately 2.0 volts and node N1 will be 2.0 volts ± 0.5 (i.e., less than 2.0 volts if the charge packet contains only a fat zero, more than 2.0 volts if the charge packet also contains a signal charge).

Operation of differentiator 20 takes place in sequential steps. In a first step, as clock CL2 falls, nodes N1 and N2 are pre-charged (initialized) to an appropriate low level $V_{dd}$. In a second step, as phase A rises, charge packets are from the CCD register and the reference injector are dumped onto nodes N1 and N2 respectively. The difference in the levels at the nodes is detected and converted to logic levels when the regenerator pulse goes on (low), by action of the regenerator transistor 206 in combination with transistors 204 and 205. After this, the first step occurs again, wherein simultaneously with nodes N1 and N2 being pre-charged, the logic level signal which is stored in amplifier 24 is transmitted as output signal $V_{Sig}$ to injector 100.

To further explain this operation, during the first step, clock CL2 falls and nodes N1 and N2 are coupled via transistor 207 so as to balance the pre-charge levels (voltages) on these nodes. The balancing is to the level of $V_{dd}$. During the second step, charge is delivered to node N1 and node N2, since they are at a low level ($V_{dd}$) while the cells (217 and 218 and the last cell of section 220) are brought to a high level by phase A. Accordingly, charge is dumped onto the nodes. Transistors 205, 204 are gated by the voltage levels of nodes N1 and N2 respectively. However, one of these transistors 204, 205 is turned on more than the other, depending on which of nodes N1 and N2 is at the lower level (i.e., which node has received the smaller charge packet). Due to the cross-coupling of nodes N1, N2 to transistors 204, 205 when the regenerator pulse goes on (low), regenerator transistor 206 is enabled and deliveres $V_{SS}$ to transistors 204, 205 and the node which was (originally) higher receives most of the voltage supplied by $V_{SS}$, i.e., goes to singificantly higher voltage level with respect to the other node. In this manner, the original minute difference between nodes N1 and N2 is amplified to a logic level corresponding to $V_{SS}$.

Of essence, in this operation of amplifier 300 is that the original, very small differences in levels between signals are gating signals for transistors 204 and 205. These gating signals act to bring one of the nodes to $V_{SS}$ (12 volts) and hold the other relatively close to 2 volts (although it may rise to about 5 volts). Clearly, this is significant amplification of the difference: the original difference of 0.5 volts is amplified to approximately 7 volts, an amplification factor of almost 15.

The need for isolation of the operation of node N1 of differentiator 20 from the SPS register may now be more readily understood. When node N1 goes to $V_{SS}$, the input terminal 301 from the SPS register does not go all the way to $V_{SS}$. Accordingly, terminal point 301 goes only by capacitive action to an acceptable level not sufficient to inject charge back into the SPS register.

The signal from regenerator 22 enables differentiator 20 to convert the input charge levels to system level voltage levels by providing $V_{SS}$ as a voltage source. With the rising edge of clock CLP, the regenerator is turned on. (Clock CL2 turns off the regenerator.)

The operation of amplifier 24 is as follows. Firstly, it is noted that the input line 25 to amplifier 24 carries the inverse of the signal represented by the charge emitted from SPS register 200 (which has been amplified by the differentiator and is found on node N1). This signal is held on line 25 by transistors 209 and 242. (Transistor 242 acts like a very large resistance.) When clock CL1 turns on, amplifier 24 is prepared to accept a signal by pre-charging of point 240 to a low level. As clock CL1 turns off, but before clock CL2 turns on, the signal on line 25 is inverted as it is passed on to point 240 and trapped (stored) there. The storage capacity of point 240 is represented by capacitor C which may be inherent line capacitance. When clock CL1 is on, point 241 is charged to $V_{SS}$. As clock CL2 goes on, the signal stored at point 240 is passed on to point 241: if the signal is high, point 241 stays at $V_{SS}$; if the signal is low, point 241 is brought to $V_{dd}$. The voltage level at point 241 corresponds to $V_{Sig}$, the output signal of the sense amplifier 300 which is used as the input signal to injector 100. Accordingly, point 241 is equivalent to output terminal 399 of amplifier 300. In the preferred embodiment shown, amplifier 24 is simply used as an inverting and amplifying storage and refresh mechanism for the signal from differentiator 20 sent to the injector 100 via amplifier 24. In this manner, control circuitry is not provided to gate this mechanism and only a single mode of operation, REFRESH, is provided. (For description of modification of the circuit so as to provide other modes of operation (READ, WRITE, PARTIAL-WRITE) see related application No. 4.)

The present invention provides an improved sense amplifier for operation in combination with a CCD register. Diode buffering of the differentiator to the CCD provides a convenient interface between these essential components of a CCD register system. Use of a reference charge injector is essential to the system design of the various concepts of the CCD register system. The reference injector contains the same process variations as the injector circuit for the register. Also, the reference charge is developed by the same clocked source method as the injected charge. Hence, a powerful self-tracking feature between the injected charge and the reference charge has been established. It is believed that use of the reference charge injector improves the basic amplifier sensitivity and stability by an order of magnitude.

In the preferred embodiment, all transistors are MOSFET transistors. Accordingly, low signals enable the transistors and high signals turn the transistors off. In the diagrams, sizes for the transistors are given in terms of surface area of a semiconductor chip. The sizes are shown as width over length (w/l) in microns and are not in anyway meant to be restrictive as alternate geometries may be employed to the same effect.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. In combination with a CCD register system, apparatus for sensing packets of charge and amplifying said sensed packets to a logic level, said apparatus comprising:
   reference means for generating reference charge by a clocked-source method of charge injection;
   differentiator means including;
      a first node coupled to a CCD register for receiving one of said packets of charge,
      a second node coupled to said reference means for receiving said reference charge,
      said differentiator means for comparing said one packet of charge to said reference charge, said differentiator means generating a signal determined by a relative size of said one packet of charge to said reference charge; and
   storage means coupled to said differentiator means for storing said generated signal; said storage means producing a first or a second logic signal in response to said stored signal upon activation of said storage means.

2. The apparatus of claim 1 further comprising:
   amplifier means coupled to said storage means for amplifying said logic signal when it is emitted by said storage means.

3. The apparatus of claim 1 wherein said apparatus is integrated within a semiconductor chip comprising said CCD register system.

4. The apparatus of claim 1 further comprising:
   first and second diode-coupled transistors coupling said first and said second nodes to said CCD register and said reference means respectively.

5. The apparatus of claim 4 wherein said first and said second diode-coupled transistors inhibit said CCD register and said reference means from receiving charge from said first and said second nodes respectively.

6. The apparatus of claim 4 wherein said differentiator means further includes:
   first and second transistors coupling said second and said first nodes respectively to a system level voltage;
   said first and said second nodes being charged to levels corresponding to said reference charge and said one packet of charge respectively;
   said first and said second transistors having gating terminals coupled to said first and said second nodes respectively, said first and said second transistors enabled to conduct different amounts of charge proportional to the difference between said reference charge and said one packet of charge.

7. The apparatus of claim 1 wherein said reference means includes:
   a clocked source,
   storage sites for effectively holding a charge packet equal to said reference change, said storage sites coupled to said clocked-source, and
   a forward blocking gate coupling said storage sites to said second node, said forward blocking gate enabled by said clocked-source.

8. An integrated circuit for amplification of packets of charge emitted from a CCD register comprising:
   reference means for generating a reference charge by a clocked-source method;
   control means for generating a control signal;
   difference means responsive to said control signal comprising:

first input means for receiving one of said packets of charge;

second input means for receiving said reference charge;

first and second transistors having enabling terminals coupled to said first and said second input means respectively, said first and said second transistors enabled to conduct different amounts of charge determined by the difference between said reference charge and said one packet of charge, and a third transistor with its gating terminal coupled to receive said control signal, said difference means generating a generated signal through said third transistor determined by said one packet of charge; and storage means coupled to said difference means for storing said, signal, said storage means providing a first or a second logic signal determined by said generated signal upon activation of said storage means.

9. The circuit of claim 8 further comprising amplifier means coupled to said storage means for amplifying said logic signal in said storage means.

10. The circuit of claim 8 wherein said difference means further includes first and second diode-coupled transistors coupling said first input means of said CCD register and said second input means to said reference means respectively, said diode-shaped transistors providing a unidirectional transfer path into said difference means.

11. The circuit of claim 8 wherein said reference means includes:

a clocked-source, storage sites for effectively holding a charge packet equal to said reference charge, said storage sites coupled to said clocked-source, and a forward blocking gate enabled by said clocked-source, said forward blocking gate providing a path for said reference charge to said second input means.

* * * * *